United States Patent
Tian

(10) Patent No.: US 11,592,853 B2
(45) Date of Patent: Feb. 28, 2023

(54) ON-CHIP RESISTOR CORRECTION CIRCUIT

(71) Applicant: Suzhou Motorcomm Electronic Technology Co., Ltd., Jiangsu (CN)

(72) Inventor: Xiaocheng Tian, Jiangsu (CN)

(73) Assignee: MOTORCOMM ELECTRONIC TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 17/534,828

(22) Filed: Nov. 24, 2021

(65) Prior Publication Data
US 2022/0404847 A1 Dec. 22, 2022

(30) Foreign Application Priority Data
Jun. 17, 2021 (CN) .......................... 2021106692383

(51) Int. Cl.
*G05F 1/46* (2006.01)
*G05F 3/26* (2006.01)

(52) U.S. Cl.
CPC .............. *G05F 1/461* (2013.01); *G05F 1/468* (2013.01); *G05F 3/262* (2013.01)

(58) Field of Classification Search
None
See application file for complete search history.

(56) References Cited

U.S. PATENT DOCUMENTS

| | | | |
|---|---|---|---|
| 7,557,558 B2* | 7/2009 | Barrow | G05F 3/262 327/539 |
| 7,898,761 B1* | 3/2011 | Voo | G11B 5/3906 360/66 |
| 8,610,421 B2* | 12/2013 | Huang | H02M 3/158 323/354 |
| 8,836,313 B2* | 9/2014 | Takagi | G05F 1/561 323/314 |
| 9,041,380 B2* | 5/2015 | Wakabayashi | H04N 5/335 323/313 |

FOREIGN PATENT DOCUMENTS

| | | |
|---|---|---|
| CN | 104601161 A | 5/2015 |
| CN | 111490751 A | 8/2020 |

* cited by examiner

*Primary Examiner* — Jeffery S Zweizig
(74) *Attorney, Agent, or Firm* — Andrew F. Young; Nolte Lackenbach Siegel

(57) ABSTRACT

An on-chip resistor correction circuit includes a first MOS transistor connected between VDD and a reference resistor, the other end of the reference resistor being grounded; an operational amplifier for outputting a first control signal based on a reference voltage and a voltage of the reference resistor; a second MOS transistor connected between VDD and a reference node; a branch where each of the on-chip resistors is located is controllably connected between the reference node and ground; a comparator for generating a comparison signal based on the voltage of the reference node and the reference voltage; and a controller for generating a control signal under the action of the comparison signal to control the branch where each of the on-chip resistors is located to turn on or off.

10 Claims, 1 Drawing Sheet

ON-CHIP RESISTOR CORRECTION CIRCUIT

CROSS REFERENCE TO RELATED INVENTIONS

This application claims priority from, and relates to, Chinese Ser. No.: SN2021106692383 filed Jun. 17, 2021, the entire contents of which are incorporated herein fully by reference.

FIGURE SELECTED FOR PUBLICATION

FIG. 1.

BACKGROUND OF THE INVENTION

1. Field of the Invention

The invention relates to the field of chip correction, in particular to an on-chip resistor correction circuit.

2. Description of the Related Art

In integrated circuits, for some applications that require resistance value to be more precise, such as for applications in high-speed and high-frequency chips, since resistors in chips will be affected by the manufacturing process, temperature and working environment during the manufacturing process, the resistors may offset, which makes resistance become too large or too small. Offset caused by the manufacturing process cannot be avoided. The precision of the resistance of the integrated resistor inside of the chip is only ±17%. However, such a precision is far from enough for specific applications.

In order to increase its precision, correction of resistors inside of the chip is necessary. In the prior art, laser trimming is typically used for such correction. Such method is carried out as follows: positioning laser beam on the resistance workpiece; cutting the film substrate of the resistance workpiece; changing the cross-sectional area of the resistance workpiece, thus, the resistance value of the resistor is changed to make it reach a specified parameter or a resistance value. Of note, such processing method is high in cost. In addition, offset exists due to change in working conditions during the trimming process, so a desired value cannot be obtained. In view of the above-mentioned problems, there is a need to design an on-chip resistor correction circuit to meet requirements set during specific applications.

SUMMARY OF THE INVENTION

An object of the invention is to provide an on-chip resistor correction circuit.

Technical problems can be solved by the following technical solution:

An on-chip resistor correction circuit is provided in the present invention, comprising:

a first MOS transistor controllably connected between VDD and a reference resistor under the action of a first control signal, the other end of the reference resistor being grounded;

an operational amplifier for performing operations on a reference voltage and the voltage of the reference resistor to output the first control signal;

a second MOS transistor controllably connected between VDD and a reference node under the action of the first control signal;

a plurality of resistors inside of the chip, wherein one of the plurality of resistors inside of the chip is connected between the reference node and ground, a branch where each of the remaining of plurality of resistors inside of the chip is located is controllably connected between the reference node and ground GND;

a comparator for generating a comparison signal by comparing the voltage of the reference node and the reference voltage; and a controller for generating a control signal under the action of the comparison signal to control the branch where each of the remaining of plurality of resistors inside the chip is located to turn on or off based on the principle of dichotomy.

Preferably, the correction circuit further comprises a plurality of switches, each of the plurality of switches and each of the remaining of plurality of resistors inside of the chip are connected between the reference node and ground;

wherein a control terminal of each of the remaining of plurality of switches is connected to the controller.

Preferably, each of the plurality of switches is made of a third MOS transistor;

a drain of each of the third MOS transistors is connected to each of the remaining of plurality of resistors inside of the chip, a source of each of the third MOS transistors is connected to ground;

a gate of each of the third MOS transistors is connected to the controller.

Preferably, a dimension of the third MOS transistor on a subsequent branch is reduced relative to a dimension of the third MOS transistor on a previous branch according to a preset ratio;

a reference value for each of the remaining of plurality of resistors inside of the chip on a subsequent branch is increased by times relative to a reference value for each of the remaining of plurality of resistors inside of the chip on a previous branch;

relationship among the remaining of plurality of resistors inside of the chip, the reference resistor, and built-in resistors of the chip is defined as:

$$R0*(1+d\%)//R_{total}=R1 \qquad (1)$$

wherein,

R0 represents a resistance value of the built-in resistor in an ideal state;

R1 represents a resistance value of the reference resistor in an ideal state;

d represents the offset of the built-in resistor after being affected by the external environment;

$R_{total}$ represents a resistance value for all the resistors inside of the chip in parallel;

$R_{total}$ can be solved by using the above-mentioned formula (1);

According to the multiple relationship among the remaining of plurality of resistors inside of the chip and a parallel principle, a resistance value x for the smallest unit of resistor in an ideal state is solved;

the actual resistance value for the smallest unit of resistor is given by $$\frac{x}{1+d\%} - y \qquad (2)$$

wherein y represents a resistance of the third MOS transistor corresponding to the smallest unit of resistor.

Preferably, an in-phase input terminal of the operational amplifier is connected to the reference voltage, and an inverting input terminal of the operational amplifier is connected to the voltage of the reference resistor.

Preferably, the reference resistor is a precision resistor.

Preferably, the gate of the first MOS transistor is connected to an output terminal of the operational amplifier, the drain of the first MOS transistor is connected to the inverting input terminal of the operational amplifier, and the source of the first MOS transistor is connected to VDD.

Preferably, the gate of the second MOS transistor is connected to an output terminal of the operational amplifier, the drain of the second MOS transistor is connected to the reference node, and the source of the second MOS transistor is connected to VDD.

Preferably, an in-phase input terminal of the comparator is connected to the reference node, an inverting input terminal of the comparator is connected to the reference voltage, and an output terminal of the comparator is connected to the controller.

Preferably, the correction circuit further comprises:

a first buffer, an input terminal of the first buffer is connected to the output terminal of the comparator;

a second buffer, an input terminal of the second buffer is connected to an output terminal of the first buffer, and an output terminal of the second buffer is connected to the controller.

By adopting the above-mentioned technical solutions, the present invention has the beneficial effects that a reference resistor is provided outside of the chip, and a temperature-independent current is generated based on the reference voltage inside the chip; the generated current is mirrored into a resistor inside the chip, the voltage generated from the internal resistor is compared with the reference voltage, so that a resistance value of the internal resistor is further adjusted to make it infinitely close to the reference resistor. Thus, correction of on-chip resistor is realized.

DETAILED DESCRIPTION

The technical solution set forth in the embodiments of the present invention will now be described clearly and fully hereinafter with reference to the accompanying drawings of the embodiments of the present invention. Obviously, such embodiments provided in the present invention are only part of the embodiments instead of all embodiments. It should be understood that all the other embodiments obtained from the embodiments set forth in the present invention by one skilled in the art without any creative work fall within the scope of the present invention.

Notably, the embodiments set forth in the present invention and features of the embodiments may be combined in any suitable manner.

The present invention will be described hereinafter with reference to the accompanying drawings and particular embodiments, but the invention is not limited thereto.

Figure 1:
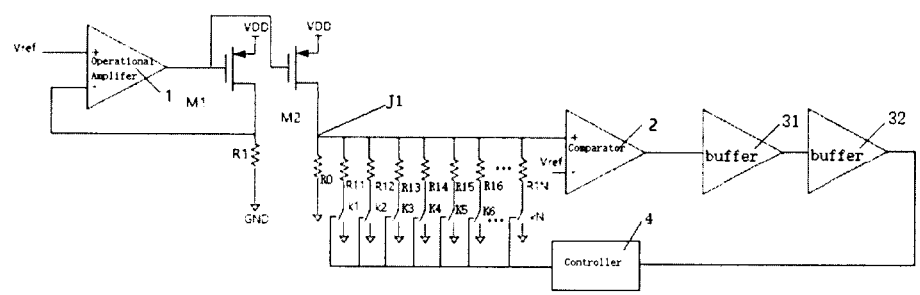
FIG. 1 is a schematic circuit diagram of an on-chip resistor correction circuit according to the present invention.
Figure 2:
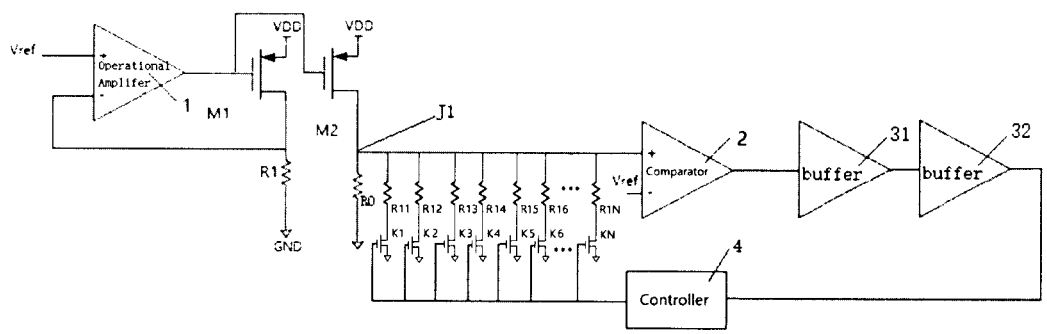
FIG. 2 is one preferred embodiments of a schematic circuit diagram of an on-chip resistor correction circuit.

The invention provides an on-chip resistor correction circuit, and it belongs to the field of chip correction. As shown in FIG. 1, the circuit comprises:

a first MOS transistor M1 controllably connected between VDD and a reference resistor R1 under the action of a first control signal, the other end of the reference resistor R1 being grounded;

an operational amplifier 1 for performing operations on a reference voltage and the voltage of the reference resistor R1 to output the first control signal;

a second MOS transistor M2 controllably connected between VDD and a reference node J1 under the action of the first control signal;

a plurality of resistors inside of the chip (R0, R11, R12 . . . R1N), wherein one of the plurality of resistors inside of the chip R0 is connected between the reference node and ground, a branch where each of the remaining of plurality of resistors inside of the chip is located is controllably connected between the reference node J1 and ground;

a comparator 2 for generating a comparison signal by comparing the voltage of the reference node J1 and the reference voltage; and a controller 4 for generating a control signal under the action of the comparison signal to control the branch where each of the remaining of plurality of resistors inside the chip is located to turn on or off based on the principle of dichotomy.

In particular, in this embodiment, a reference voltage Vref is set in the chip, and the reference voltage Vref will not be affected by the environment. Due to the negative feedback effect of the reference resistor R1, the operational amplifier 1 will output a stable voltage. The operational amplifier 1 performs operations on the reference voltage in the chip and the voltage of the external reference resistor R1 to output a first control signal. The first MOS transistor M1 is turned on or off under the action of the first control signal output from the operational amplifier 1, so as to make the current flowing through the first MOS transistor M1 relatively stable, that is, the current is not affected by the temperature. The second MOS transistor M2 mirrors the stable current flowing through the first MOS transistor M1 to the reference node J1. The comparator 2 compares the voltage of the reference node J1 with the reference voltage. The controller 4 generates a control signal based on the comparison result output from the comparator 2, and controls according to the control signal a branch where each of the plurality of resistors inside the chip is located to turn on or off, to adjust the resistance value of the internal resistor until the voltage (the voltage of the reference node J1) at two ends of the internal resistor is infinitely close to the reference resistor.

Furthermore, the chip also comprises a built-in resistor R0. The built-in resistor R0 is a normally-on resistor. The built-in resistor R0 is connected between the reference node J1 and ground. After being corrected, the built-in resistor R0 and all the resistors inside of the chip on the branches which are turned on have a shunt resistance value equal to the resistance value of the reference resistor R1.

In a preferred embodiment, it further comprises:

a plurality of switches (K1, K2 . . . KN), each of the plurality of switches (K1, K2 . . . KN) and each of the remaining of plurality of resistors inside of the chip are connected between the reference node J1 and ground;

In a preferred embodiment, a control terminal of each of the remaining of plurality of switches (K1, K2 . . . KN) is connected to the controller 4.

In a preferred embodiment, each of the plurality of switches is made of a third MOS transistor;

a drain of each of the third MOS transistors is connected to each of the remaining of plurality of resistors inside of the chip, a source of each of the third MOS transistors is connected to ground;

a gate of each of the third MOS transistors is connected to the controller.

In particular, the MOS transistor can be used as the switch to control on/off of the branch where each of the remaining of plurality of resistors inside the chip is located.

In a preferred embodiment, a dimension of the third MOS transistor on a subsequent branch is reduced relative to a dimension of the third MOS transistor on a previous branch according to a preset ratio;

a reference value for each of the remaining of plurality of resistors inside of the chip on a subsequent branch is increased by times relative to a reference value for each of the remaining of plurality of resistors inside of the chip on a previous branch;

relationship among the remaining of plurality of resistors inside of the chip, the reference resistor, and built-in resistors of the chip is defined as:

$$R0*(1+d\%)//R_{total}=R1 \qquad (1)$$

wherein,

R0 represents a resistance value of the built-in resistor in an ideal state;

R1 represents a resistance value of the reference resistor in an ideal state;

d represents the offset of the built-in resistor after being affected by the external environment;

$R_{total}$ represents a resistance value for all the resistors inside of the chip in parallel;

$R_{total}$ can be solved by using the above-mentioned formula (1);

According to the multiple relationship among the remaining of plurality of resistors inside of the chip and a parallel principle, a resistance value x for the smallest unit of resistor in an ideal state is solved;

the actual resistance value for the smallest unit of resistor is given by $$\frac{x}{1+d\%}-y \qquad (2)$$

wherein y represents a resistance of the third MOS transistor corresponding to the smallest unit of resistor.

In particular, the MOS transistor itself will also have a resistance when it is turned on. When the built-in resistor R0 and the resistor inside of the chip on the branch which is turned on are connected in parallel, that is, after the resistor inside of the chip on the branch which is turned on plus the resistance value of the MOS transistor, they are connected in parallel with the built-in resistor R0, affecting the precision of the correction of resistance. In this embodiment, the dimensions of the MOS transistors in the multi-level branch are different, and they are reduced in sequence according to a preset ratio, that is, the dimension of the MOS transistor in a subsequent branch and the dimension of the MOS transistor in a previous branch are reduced in multiples according to a preset ratio. The larger the dimension, the smaller the internal resistance in the chip of the MOS transistor. Therefore, the resistance value of the MOS transistor in a subsequent branch and the resistance value of the MOS transistor in a previous branch are increased in multiples according to a preset ratio. Preferably, the preset ratio is two times.

In particular, a branch where each of the remaining of plurality of resistors inside the chip is located further comprises a switch. The switch is connected in series with a corresponding resistor of the remaining of plurality of resistors inside of the chip in the branch. The remaining of plurality of resistors inside of the chip (R11, R12 . . . R1N), together with a plurality of switches (K1, K2 . . . KN), form an array of resistors. The resistance values of the remaining of plurality of resistors inside of the chip in the array of resistors are increased in multiples. Preferably, the resistance values of the resistors inside of the chip in a subsequent branch is 2 times higher than that of the resistors inside of the chip in a previous branch.

Furthermore, the resistance values of resistors inside of the chip offset due to the influence of manufacturing progress, temperature and working environment during production of the resistors. The total parallel resistance of all the resistors inside of the chip in the array of resistors is set to about 17% of the resistance of the reference resistor R1, so that correction of the offset resistance can be done by turning on or off the branches where resistors inside of the chip are located.

Furthermore, for the purpose of illustration, an array of internal resistors is composed of six shunt branches, that is, the internal resistors comprise a first resistor R11, a second resistor R12, a third resistor R13, a fourth resistor R14, a fifth resistor R15, and a sixth resistor R16.

A method for determining the resistance x of the smallest unit of resistor (i.e., the first resistor R11) of the remaining of plurality of resistors inside of the chip is as follows:

assuming that the current resistance value of the resistor R0 is offset downward by 17%, that is, the resistance value of the resistor R0 is R0(1-17%) after it is offset, the internal resistor needs to be increased to correct the offset. After the resistors are connected in parallel, the resistance is reduced. Therefore, the six branches are disconnected then, that is, the offset of the internal resistance is corrected by the resistor R0. Thus, the actual resistance of the resistance R0 needs to be set to R0*1.17. Assuming that the resistance value of the resistor R0 is 2.4K, that is, the actual resistance value of the resistor R0 is 2.4K*1.17, so that the internal resistance that is offset downward by 17% can be corrected to a normal state.

Assuming that the current resistance value of the resistor R0 is offset upward by 17%, since the actual resistance value of the resistor R0 is 2.4K*1.17, i.e., the resistance is 2.4K*1.17$^2$ after it is offset. Assuming that all branches (that is, six branches) need to be closed to correct the offset, that is, the total shunt resistance value after all branches (that is, six branches) are closed is $R_{total}$, after 2.4K*1.17$^2$ and $R_{total}$ are connected in parallel, the resistance value needs to be equal to the resistance value of the reference resistor R1, 2.4K, then the resistance value of $R_{total}$ is calculated as 2.4K/2.4K*1.17$^2$, that is, the resistance value of the six branches connected in parallel is 2.4K/2.4K*1.17$^2$, assuming R11=x, R12=2×, R13=4×, R14=8×, R15=16×, R16=32×, the minimum unit resistance x can be calculated according to the resistance value of six branches connected in parallel is equal to $R_{total}$;

Furthermore, all the resistors inside of the chip are in the same working environment, so all of the resistors are offset by the same value, that is, the resistance value of all the resistors is offset upward by 17%. Thus, the obtained value x is divided by 1.17, the resistance value of the first resistor is x/1.17.

Furthermore, since the MOS transistor connected in series with each of the resistors inside of the chip also has resistance, the calculated x/1.17 further comprises the resistance value of the MOS transistor, so the resistance value of the MOS transistor needs to be subtracted from x/1.17, the obtained resistance value is the final smallest unit of resistance value of the plurality of resistors inside of the chip. As a preferred embodiment, the in-phase input terminal of the operational amplifier 1 is connected to the reference voltage, and the inverting input terminal of the operational amplifier 1 is connected to the voltage of the reference resistor R1.

In particular, the reference voltage and the voltage of the reference resistor R1 are input into the operational amplifier 1, and the operational amplifier 1 performs the operation to ensure that the output voltage signal is stable and reliable.

In a preferred embodiment, the reference resistor R1 is a precision resistor.

In particular, the reference resistor R1 provided outside the chip is a precision resistor. The precision resistance varies little or is not affected by the external environment, so that the current flowing through the first MOS transistor M1 is less affected by the current.

In a preferred embodiment, the gate of the first MOS transistor M1 is connected to an output terminal of the operational amplifier 1, the drain of the first MOS transistor M1 is connected to the inverting input terminal of the operational amplifier 1, and the source of the first MOS transistor M1 is connected to VDD.

In a preferred embodiment, the gate of the second MOS transistor M2 is connected to an output terminal of the operational amplifier 1, the drain of the second MOS transistor M2 is connected to the reference node J1, and the source of the second MOS transistor M2 is connected to VDD.

In particular, the second MOS transistor M2 mirrors stable current flowing through the first MOS transistor M1 to an interior of the chip, wherein both the first MOS transistor M1 and the second MOS transistor M2 are PMOS transistors.

In a preferred embodiment, an in-phase input terminal of the comparator 2 is connected to the reference node J1, an inverting input terminal of the comparator 2 is connected to the reference voltage, and an output terminal of the comparator 2 is connected to the controller 4.

In particular, the reference voltage and the voltage of the reference node J1 are input into the comparator 2, and the reference voltage is compared with the voltage of the reference node J1 by the comparator 2 to output a comparison result;

if the comparison result indicates that the voltage of the reference node J1 is greater than the reference voltage, the comparator 2 outputs a result of 1;

if the comparison result indicates that the voltage of the reference node J1 is less than the reference voltage, the comparator 2 outputs a result of 0.

In a preferred embodiment, the correction circuit further comprises:

a first buffer 31, an input terminal of the first buffer 31 is connected to the output terminal of the comparator 2;

a second buffer 32, an input terminal of the second buffer 32 is connected to an output terminal of the first buffer 31, and an output terminal of the second buffer 32 is connected to the controller 4.

In a preferred embodiment, the controller 4 controls a branch where each of the remaining of plurality of resistors inside the chip is located to turn on or off based on the principle of dichotomy.

In a preferred embodiment, after correction of resistance, the resistance value of all the shunt resistors inside of the chip on all the branches which are turned on is equal to the resistance value of the reference resistor R1.

In particular, the controller 4, according to the comparison result, controls a branch where each of the remaining of plurality of resistors inside the chip is located to turn on or off based on the principle of dichotomy. The correction is completed when the comparison result jumps (i.e., the result is changed from 1 to 0, or, from 0 to 1). After the correction is completed, the resistance value of all the shunt resistors inside of the chip on all the branches which are turned on is equal to the resistance value of the reference resistor R1.

Furthermore, the controller 4 outputs a control signal according to the result output by the comparator 2. When the comparison result is 1, the internal resistance is offset since it is affected by the manufacturing process, temperature and working environment. The resistance is too large and needs to be reduced. Due to the characteristics of the shunt circuit, it is necessary to add a shunt resistor to shunt at this time, that is, a branch or a plurality of branches where one or more internal resistors are located are closed. Generally, only one branch is closed or disconnected at a time, then the voltage of the reference node J1 is observed, and then it is determined whether it is necessary to adjust the on-off of the branch once more;

Similarly, when the comparison result is 0, the resistance is too small and needs to be increased. At this time, a shunt resistor needs to be disconnected.

The criterion for judging whether it is necessary to adjust the on-off of the branch is that the comparison result output by the comparator 2 jumps, that is, from 1 to 0, or from 0 to 1.

Furthermore, for the purpose of illustration, an array of internal resistors is composed of six shunt branches, that is, the internal resistors comprise a first resistor R11, a second resistor R12, a third resistor R13, a fourth resistor R14, a fifth resistor R15, and a sixth resistor R16. Each of the resistors comprises a first switch, a second switch, a third switch, a fourth switch, and a fifth switch connected in series therewith, respectively, and all the switches herein may be MOS transistors. The resistance value of a primary-level resistor in a branch is twice that of a secondary-level resistor, that is, the resistance value of the fifth resistor is twice that of the fourth resistor, and similarly, the resistance value of the fourth resistor is twice that of the third resistor. Resistance of other resistors will not be repeated herein.

Assuming that the initial working state of the switch in the six branches is "101000", it means that the sixth switch and the fourth switch are closed, and the other switches are open. At this time, the sixth resistor and the fourth resistor are the currently connected resistors:

If the comparison result indicates that the voltage of the reference node J1 is greater than the reference voltage, it is required to add another resistor in parallel. Based on the rule of dichotomy, the working state of the switches in the six branches needs to be controlled to "110100", that is, the sixth resistor remains unchanged, and the branch where the four resistors are located is disconnected, and the branches where the fifth resistor and the third resistor are located are closed. If the result output by the comparator 2 jumps, the correction is completed. If the comparison result is still 1, then continue to correct according to the above-mentioned steps.

If the comparison result indicates that the voltage of the reference node J1 is less than the reference voltage, it is required to have one resistor of the currently-on resistors disconnected. Based on the rule of dichotomy, the working state of the switches in the five branches needs to be controlled to "010100", that is, the branches where the sixth resistor and the fourth resistor are located are disconnected, and the branches where the fifth resistor and the third resistor are located are closed. If the result output by the comparator 2 jumps, the correction is completed. If the comparison result is still 0, then continue to correct according to the above-mentioned steps.

Furthermore, in this embodiment, the initial state "100000" can be assigned to the six branches first, that is, the branch where the sixth resistor is located is closed, and the branches where other resistors are located are disconnected, and then control of on/off state of each branch is performed according to the dichotomy.

The invention has the following beneficial effects: a reference resistor is provided outside of the chip, and a temperature-independent current is generated based on the reference voltage inside the chip; the generated current is mirrored into a resistor inside the chip, the voltage of the internal resistor is compared with the reference voltage, then resistance value of the internal resistor is adjusted to make it infinitely close to the reference resistor. Thus, resistance value of the internal resistor is corrected.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. An on-chip resistor correction circuit, comprising:
a first MOS transistor controllably connected between VDD and a reference resistor under the action of a first control signal, the other end of the reference resistor being grounded;
an operational amplifier for performing operations on a reference voltage and a voltage of the reference resistor to output the first control signal;
a second MOS transistor controllably connected between VDD and a reference node under the action of the first control signal;
a plurality of resistors inside of the chip, wherein one of the plurality of resistors inside of the chip is connected between the reference node and ground, wherein each of the remaining of the plurality of resistors inside of the chip is controllably connected between the reference node and ground;
a comparator for generating a comparison signal by comparing the voltage of the reference node and the reference voltage; and
a controller for generating a control signal under the action of the comparison signal to control each of the remaining of plurality of resistors inside the chip to turn on or off based on the principle of dichotomy.

2. The on-chip resistor correction circuit of claim 1, further comprising:
a plurality of switches, each of the plurality of switches and each of the remaining of plurality of resistors inside of the chip are connected between the reference node and ground;
wherein a control terminal of each of the remaining of plurality of switches is connected to the controller.

3. The on-chip resistor correction circuit of claim 2, wherein each of the plurality of switches is made of a third MOS transistor;
a drain of each of the third MOS transistors is connected to each of the remaining of plurality of resistors inside of the chip, a source of each of the third MOS transistors is connected to ground;
a gate of each of the third MOS transistors is connected to the controller.

4. The on-chip resistor correction circuit of claim 3, wherein a dimension of the third MOS transistor with a serial number i+1 is reduced relative to a dimension of the third MOS transistor with a serial number i according to a preset ratio, i is greater than or equal to 1 and less than or equal to N;
a reference value for one of the remaining of plurality of resistors inside of the chip with a serial number 1 j is increased by times relative to a reference value for one of the remaining of plurality of resistors inside of the chip with a serial number 1i, j=i+1, i is greater than or equal to 1 and less than or equal to N;
relationship among the remaining of plurality of resistors inside of the chip, the reference resistor, and the one of the plurality of resistors of the chip is defined as:

$$R0*(1+d\%)//R_{total}=R1$$

wherein,
$R0$ represents a resistance value of the one of the plurality of resistors in an ideal state;
$R1$ represents a resistance value of the reference resistor in an ideal state;
$d$ represents the offset of the one of the plurality of resistors after being affected by the external environment;
$R_{total}$ represents a resistance value for the plurality of resistors inside of the chip.

5. The on-chip resistor correction circuit of claim 1, wherein an in-phase input terminal of the operational amplifier is connected to the reference voltage, and an inverting input terminal of the operational amplifier is connected to the voltage of the reference resistor.

6. The on-chip resistor correction circuit of claim 1, wherein the reference resistor is a precision resistor.

7. The on-chip resistor correction circuit of claim 1, wherein the gate of the first MOS transistor is connected to an output terminal of the operational amplifier, the drain of the first MOS transistor is connected to the inverting input terminal of the operational amplifier, and the source of the first MOS transistor is connected to VDD.

8. The on-chip resistor correction circuit of claim 1, wherein the gate of the second MOS transistor is connected to an output terminal of the operational amplifier, the drain of the second MOS transistor is connected to the reference node, and the source of the second MOS transistor is connected to VDD.

9. The on-chip resistor correction circuit of claim 1, wherein an in-phase input terminal of the comparator is connected to the reference node, an inverting input terminal of the comparator is connected to the reference voltage, and an output terminal of the comparator is connected to the controller.

10. The on-chip resistor correction circuit of claim 1, further comprising:
a first buffer, an input terminal of the first buffer is connected to the output terminal of the comparator;
a second buffer, an input terminal of the second buffer is connected to an output terminal of the first buffer, and an output terminal of the second buffer is connected to the controller.

* * * * *